(12) United States Patent
Spruth et al.

(10) Patent No.: US 9,595,350 B2
(45) Date of Patent: Mar. 14, 2017

(54) HARDWARE-BASED MEMORY INITIALIZATION

(71) Applicants: Henning F. Spruth, Austin, TX (US); Qadeer A. Qureshi, Dripping Springs, TX (US); Reinaldo Silveira, Sao Paulo (BR)

(72) Inventors: Henning F. Spruth, Austin, TX (US); Qadeer A. Qureshi, Dripping Springs, TX (US); Reinaldo Silveira, Sao Paulo (BR)

(73) Assignee: NXP USA, INC., Austin, TX (US)

( * ) Notice: Subject to any disclaimer, the term of this patent is extended or adjusted under 35 U.S.C. 154(b) by 773 days.

(21) Appl. No.: 13/668,951

(22) Filed: Nov. 5, 2012

(65) Prior Publication Data

US 2014/0129883 A1  May 8, 2014

(51) Int. Cl.

| | |
|---|---|
| *G11C 29/00* | (2006.01) |
| *G11C 29/12* | (2006.01) |
| *G11C 7/20* | (2006.01) |
| *G11C 7/24* | (2006.01) |
| *G01R 31/3181* | (2006.01) |
| *G01R 31/3187* | (2006.01) |

(52) U.S. Cl.
CPC ............... *G11C 29/12* (2013.01); *G11C 7/20* (2013.01); *G11C 7/24* (2013.01); *G01R 31/3181* (2013.01); *G01R 31/3187* (2013.01)

(58) Field of Classification Search
CPC ............. G06F 7/58; G01R 31/318385; G01R 31/31813; G01R 31/3183; G01R 31/3187; G01R 31/31917; H03M 2201/835; H04L 9/0656; H04L 9/0662; H04L 2209/26; G11C 29/12; G11C 2029/12; G11C 29/08; G11C 29/36; G11C 29/3602
USPC ............... 714/718, 728, 726, 739, 733, 742, 714/E11.169
See application file for complete search history.

(56) References Cited

U.S. PATENT DOCUMENTS

| | | | | |
|---|---|---|---|---|
| 3,651,315 A | * | 3/1972 | Collins | G01R 31/3193 714/736 |
| 5,043,874 A | * | 8/1991 | Gagliardo | G06F 12/0607 711/150 |
| 5,138,619 A | * | 8/1992 | Fasang | G11C 29/20 714/718 |
| 5,257,268 A | * | 10/1993 | Agrawal | G01R 31/318342 714/738 |
| 5,444,716 A | * | 8/1995 | Jarwala | G01R 31/318566 714/727 |
| 6,067,262 A | * | 5/2000 | Irrinki | G11C 29/006 365/200 |
| 6,510,534 B1 | * | 1/2003 | Nadeau-Dostie | G01R 31/318552 714/724 |

(Continued)

*Primary Examiner* — Albert Decady
*Assistant Examiner* — Osman M Alshack

(57) ABSTRACT

Systems and methods for hardware-based initialization of memory circuitry. In some embodiments, a method may include, after completion and/or independently of an integrity test of a memory circuit, generating a sequence of random logic values using a Built-In-Self-Test (BIST) circuit. The method may further include initializing the memory circuit with the sequence of random logic values using the BIST circuit. In some implementations, the sequence of logic values may be generated using memory circuit identification, chip identification, and/or clock information as a seed state.

13 Claims, 2 Drawing Sheets

(56) References Cited

U.S. PATENT DOCUMENTS

| | | | |
|---|---|---|---|
| 6,665,249 B2 | 12/2003 | Liew | |
| 6,769,081 B1* | 7/2004 | Parulkar | G11C 29/16 |
| | | | 714/733 |
| 6,779,141 B1* | 8/2004 | Pendurkar | G11C 29/56004 |
| | | | 365/201 |
| 6,934,884 B1* | 8/2005 | Wakabayashi et al. | 714/30 |
| 8,661,302 B2* | 2/2014 | Gorti | G06F 11/2236 |
| | | | 714/36 |
| 2002/0147949 A1* | 10/2002 | Lamb | G11C 5/147 |
| | | | 714/718 |
| 2003/0065998 A1* | 4/2003 | Rios-Baez | G11C 29/40 |
| | | | 714/718 |
| 2004/0143710 A1* | 7/2004 | Walmsley | B41J 2/04505 |
| | | | 711/144 |
| 2005/0204239 A1* | 9/2005 | Miyaji | G11C 29/36 |
| | | | 714/738 |
| 2006/0095817 A1* | 5/2006 | Lee | G11C 5/04 |
| | | | 714/719 |
| 2007/0226568 A1* | 9/2007 | Anzou | G01R 31/318575 |
| | | | 714/733 |
| 2007/0245182 A1* | 10/2007 | Sugiura et al. | 714/720 |
| 2010/0005281 A1* | 1/2010 | Buchmann | G06F 13/4243 |
| | | | 713/2 |
| 2010/0271891 A1* | 10/2010 | Dell | G11C 5/06 |
| | | | 365/200 |
| 2011/0066903 A1* | 3/2011 | Foster, Sr. | G06F 1/206 |
| | | | 714/723 |
| 2012/0204040 A1* | 8/2012 | Schwartz et al. | 713/193 |
| 2012/0246527 A1* | 9/2012 | Anzou | G11C 29/10 |
| | | | 714/719 |
| 2013/0086440 A1* | 4/2013 | Hamdioui et al. | 714/718 |

* cited by examiner

HARDWARE-BASED MEMORY INITIALIZATION

FIELD

This disclosure relates generally to electronic devices, and more specifically, to systems and methods for hardware-based initialization of memory circuitry.

BACKGROUND

Semiconductor fabrication is a process employed to create integrated circuits used in modern-day electronic devices. The process typically involves a sequence of photolithographic and chemical operations performed upon a semiconducting material. Once the fabrication process is completed, the resulting semiconductor device or "chip" may be subjected to one or more tests to determine whether it functions properly. In many cases, a manufactured chip may be probed with an external electronic tester or machine prior to leaving the fabrication facility. However, external testing devices can be complicated and expensive, can require that dedicated test pins be built onto the chips, and can result in long test times.

Accordingly, in some cases, chip manufacturers now incorporate testing mechanisms into their own circuit designs. For example, a Built-in Self-Test (BIST) circuit may be fabricated onto a chip and used to deliver a sequence of tests to an electrical circuit (e.g., a memory module, etc.) within that chip to perform a fault detection procedure. Generally speaking, a BIST circuit may be configured to translate a test algorithm into a sequence of commands, data, and/or addresses to be applied to the circuit(s) being tested. As the inventors hereof have recognized, however, BIST circuits or the like are generally only used to perform self-tests, whether in the fabrication facility or out in the field.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Embodiments disclosed herein are directed to systems and methods for hardware-based initialization of memory circuitry. In many implementations, some of these systems and methods may be incorporated into a wide range of electronic devices including, for example, computer systems or Information Technology (IT) products (e.g., servers, desktops, laptops, switches, routers, etc.), telecommunications hardware, consumer devices or appliances (e.g., mobile phones, tablets, televisions, cameras, sound systems, etc.), scientific instrumentation, industrial robotics, medical or laboratory electronics (e.g., imaging, diagnostic, or therapeutic equipment, etc.), transportation vehicles (e.g., automobiles, buses, trains, watercraft, aircraft, etc.), military equipment, or any other device or system having one or more electronic parts or components. Generally speaking, such electronic devices may include one or more integrated circuits (or "chips"), and each chip may include one or more memory circuits.

Figure 1:
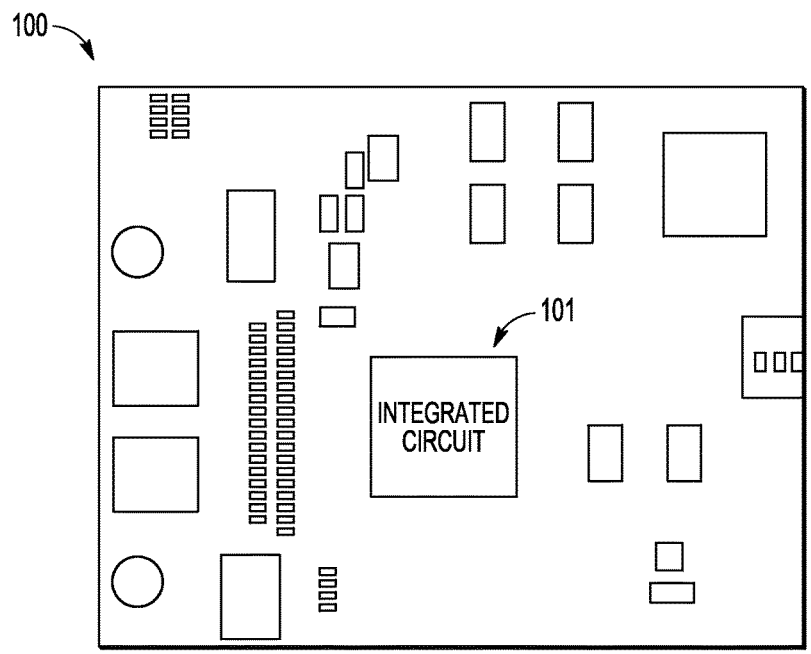
FIG. 1 is a diagram of a Printed Circuit Board (PCB) having one or more integrated circuits mounted thereon according to some embodiments.

Turning to FIG. 1, a block diagram of an example of a Printed Circuit Board (PCB) within an electronic device is depicted. As illustrated, PCB 100 may include one or more integrated circuits 101. In some embodiments, the electronic device may have network communication capabilities, and integrated circuit 101 may include one or more network processor(s) or the like.

Examples of suitable integrated circuit(s) 101 may include, for instance, a System-On-Chip (SoC), an Application Specific Integrated Circuit (ASIC), a Digital Signal Processor (DSP), a Field-Programmable Gate Array (FPGA), a processor, a microprocessor, a controller, a microcontroller (MCU), and/or the like. Moreover, integrated circuit(s) 101 may include a tangible memory apparatus including, but not limited to, a Random Access Memory (RAM), a Static RAM (SRAM), a Magnetoresistive RAM (MRAM), a Nonvolatile RAM (NVRAM, such as "FLASH" memory, etc.), and/or a Dynamic RAM (DRAM) such as Synchronous DRAM (SDRAM), a Double Data Rate (e.g., DDR, DDR2, DDR3, etc.) RAM, an Erasable Programmable ROM (EPROM), an Electrically Erasable Programmable ROM (EEPROM), etc. As such, integrated circuit(s) 101 may include a number of different portions, areas, or regions; such as, for example, processing cores, cache memories, internal bus(es), timing units, controllers, etc.

Generally speaking, integrated circuit(s) 101 may be disposed within an electronic component package configured to be mounted onto PCB 100 using any suitable packaging technology such as, for example, Ball Grid Array (BGA) packaging or the like. In a given application, PCB 100 may itself be mechanically mounted within an electronic device or the like. It should be noted that, in particular implementations, PCB 100 may take a variety of forms and/or may include a plurality of other elements or components in addition to integrated circuit(s) 101.

Figure 2:
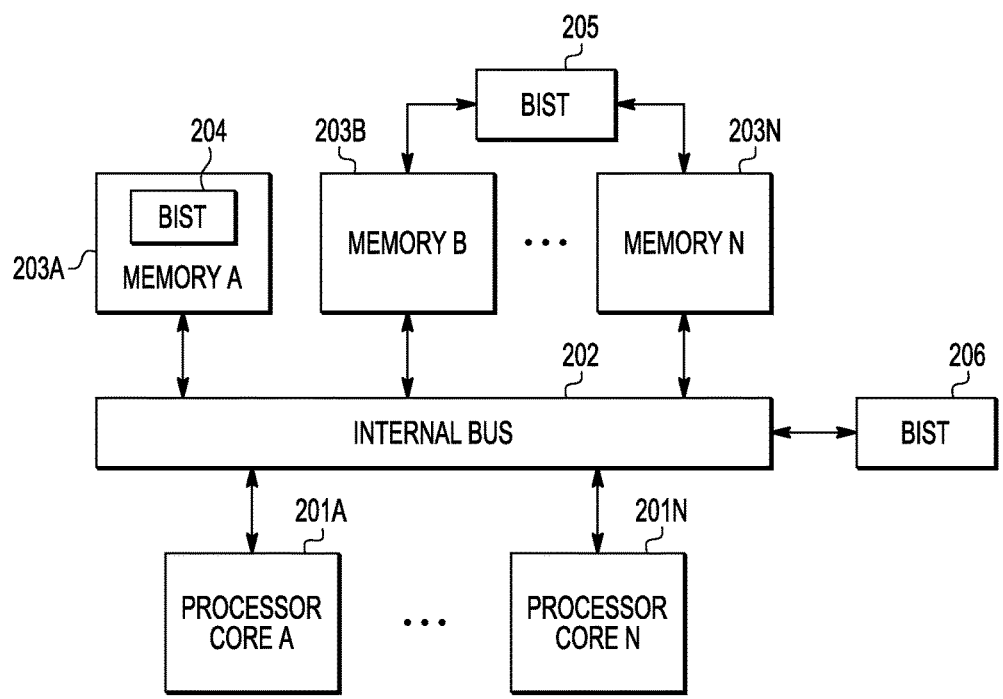
FIG. 2 is a block diagram of an example of an integrated circuit according to some embodiments.

FIG. 2 is a block diagram of integrated circuit 200 that illustrates an example of integrated circuit(s) 101, according to some embodiments. As shown, integrated circuit 200 includes one or more processors or processor core(s) 201A-N operably coupled to internal or input/output (I/O) bus 202. Integrated circuit 200 also includes one or more memory circuit(s) or device(s) 203A-N operably coupled to internal bus 202. Built-In Self-Test (BIST) circuit(s) 204-206 are shown in different configurations. Particularly, first BIST circuit 204 is integrated into memory 203A, second BIST circuit 205 is operably coupled to and/or shared across two or more distinct memory circuits 203B-N, and third BIST circuit 206 is operably coupled to internal bus 202.

It should be noted that the combination of different configurations of BIST circuits 204-206 in the same integrated circuit 200 is provided for illustration purposes only. In some implementations, each of memories 203A-N may have its own internal BIST circuit; that is, similarly to memory 203A and first BIST circuit 204. In other cases, all memories 203A-N may share a single BIST circuit located outside of memories 203A-N and directly coupled thereto; that is, similarly to memories 203B-N and second BIST circuit 205. And in yet other cases, all memories 203A-N may share third BIST circuit 206 located outside of memories 203A-N but operably, albeit indirectly coupled thereto via internal bus 205.

Processor core(s) 201A-N may be any suitable processor core capable of executing program instructions. For example, in various embodiments, processor core(s) 210A-N may be general-purpose or embedded processor(s) implementing any of a variety of Instruction Set Architectures (ISAs). In multi-processor systems, each of processor core(s) 210A-N may commonly, but not necessarily, implement the same ISA. In some embodiments, at least one of processor core(s) 210A-N may be an application-specific processing unit such as, for example, a network processor, a Graphics Processing Unit (GPU), or other dedicated device.

As previously noted, each of memory circuit(s) 203A-N may include any suitable memory apparatus such as, for example, RAM, SRAM, MRAM, NVRAM, FLASH, DRAM, SDRAM, DDR SDRAM, EPROM, EEPROM, etc.

BIST circuit(s) 204-206 may be configured to apply a sequence of commands and/or data to one or more memory circuit(s) 203A-N under test. After executing the commands and/or writing the data to memory circuit(s) 203A-N, BIST circuit(s) 204-206 may read the data stored in memory circuit(s) 203A-N to determine whether memory circuit(s) 203A-N are operating properly. For example, BIST circuit(s) 204-206 may determine whether the data intended to be written to the memory was actually stored in the memory, and later the same expected data was read from that memory. Such tests may be referred to as "integrity tests" or the like, because they are generally is designed to verify the integrity of a respective memory circuit.

In some cases, an integrity test may be performed after fabrication of integrated circuit 200 while still in a semiconductor fabrication facility. And, once the integrity test is completed and the memory circuit is determined to be functional, BIST circuit(s) 204-206 may be no longer used. In other cases, BIST circuit(s) 204-206 may be designed to evaluate the integrity of their corresponding memory circuit(s) 203A-N after integrated circuit 200 has already been deployed in the field, for example, as part of a diagnostics procedure or the like. Examples of BIST circuit(s) 204-206 according to some embodiments are described in more detail below with respect to FIG. 3.

Still referring to FIG. 2, one or more components 201A-N, 203A-N and/or 206 are operably coupled to internal or I/O bus 202. As such, internal bus 202 may be used to couple master and slave components together, for example, to share data or perform other data processing operations. In various embodiments, internal bus 202 may implement any suitable bus architecture. Additionally or alternatively, internal bus 202 may include, for example, a cross switch, crossbar switch, or the like. In other embodiments, however, internal bus 202 may be absent and memory 203A, for example, maybe integrated into processor core 201A.

Figure 3:
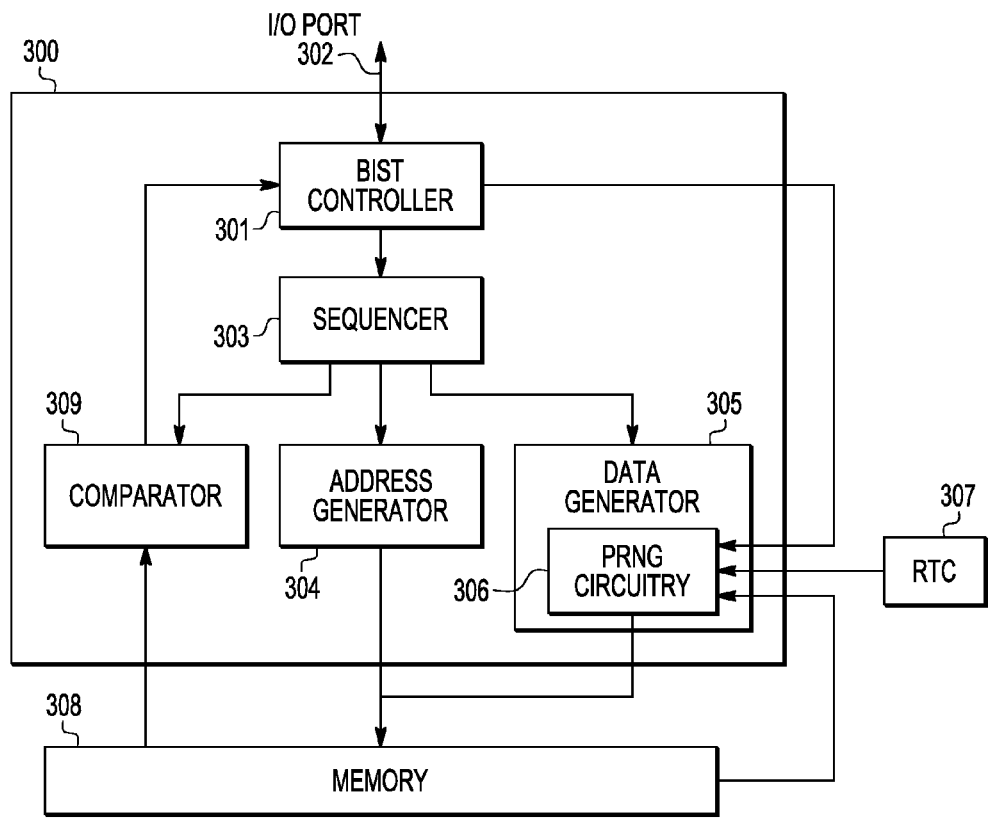
FIG. 3 is a block diagram of an example of a Built-In-Self-Test (BIST) circuit according to some embodiments.

FIG. 3 is a block diagram of an example of a BIST circuit coupled to memory circuitry. In some embodiments, BIST circuit 300 may implement one of BIST circuits 204-206 and memory circuitry 308 may implement one or more of memory circuit(s) 203A-N, as shown in FIG. 2. As illustrated, BIST controller 301 may transmit and/or receive one or more commands or instructions via I/O port 302, for example, to and/or from processor core(s) 201A-N or other component within or outside of integrated circuit 200. BIST controller 301 may be operably coupled to: comparator 309, address generator 304, and data generator 305—each of which may be operably coupled to memory circuitry 308. Data generator 305 may include Pseudo-Random Number Generator (PRNG) circuitry 306, which may itself be operably coupled to one or more of: BIST controller 301, Real-Time Clock (RTC) circuit 307, or memory circuitry 308.

In some implementations, PRNG circuitry 306 may be deployed with low hardware overhead using a Linear Feedback Shift Register (LFSR) circuit or the like. As such, PRNG circuitry 306 may occupy a relatively small area on the order of one flip flop per data bit of a maximum data width driven by BIST circuit 300.

In some cases, BIST circuit 300 may operate in "self-test" mode. When in self-test mode, BIST controller 301 may receive an instruction, for example, via I/O port 302 or from processor core(s) 201A-N, to execute a test configured to verify the integrity of memory circuitry 308. Sequencer 303 may synchronize or otherwise control the sequence of operation of comparator 309, address generator 304, and data generator 305. For instance, address generator 304 may determine which memory addresses of memory circuitry 308 are being tested, and data generator 305 may generate a sequence of logic values (i.e., "0s" and "1s") to be written to those addresses.

After the data is written onto memory circuitry 308, sequencer 303 may instruct comparator 309 to read the content of memory circuitry 308 and to make a comparison between the data stored in memory circuitry 308 and the data generated by data generator 305. The results of the comparison may be presented to BIST controller 301, which may in turn communicate those results to another circuit, for example, via I/O port 302 or from processor core(s) 201A-N. In some cases, BIST circuit 300 may be configured to "repair" a portion of memory circuitry 308 depending upon the results of the comparison, for example, by replacing a damaged set of memory cells within memory circuitry 308 with a spare set of working memory cells using a suitable redundancy technique.

As previously noted, outside of a "self-test" scenario, BIST circuit 300 would ordinarily not be used. In various embodiments described herein, however, BIST circuitry 300 may also be configured to operate in "memory initialization" mode.

When in memory initialization mode, BIST circuit 300 may be employed so that logic values may be written to memory circuitry 308 not just during chip production and self-test, but also in connection with a "Power-on-Reset" (PoR) event and/or during normal operation of integrated circuit 200. For example, a PoR event may include one or more actions performed by or upon a chip in response to the turning on of power to the electronic device or part(s) thereof, or other command that creates a reset signal configured to place the chip in a known state.

In some embodiments, PRNG circuitry 306 of data generator 305 may be configured to enable memory initialization with pseudo-random values. More specifically, to ensure different random content for each device and/or memory circuitry, a seed state may be provided to PRNG circuitry 306. Such a seed state may be programmed explicitly, for example, as a Register Transfer Language (RTL) constant received via I/O port 302 or the like. Additionally or alternatively, a seed state may be tied to certain hardware component(s) within integrated circuit 200. For instance, the seed state may be based upon chip-specific data (e.g., chip identification or ID, memory ID, lot number, etc.) and/or may be a random value (e.g., provided by RTC circuit 307 and/or other timing circuit), as discussed in more detail below. Depending upon the number of bits used by PRNG circuitry 306, other configuration inputs such as, for example, a base offset used for address decoding, etc. may be used. These and other operations are described in more detail in connection with FIG. 4 below.

In some implementations, while in memory initialization mode, comparator 309 may be inoperative, as there may not be a need for it to read stored values and/or compare those values against expected values. Furthermore, memory circuitry 308 may be written at or approximately at its maximum clock frequency.

In various embodiments, the modules or blocks shown in FIGS. 2 and/or 3 may represent processing circuitry, logic functions, and/or data structures. Although these modules are shown as distinct blocks, in other embodiments at least some of the operations performed by these modules may be combined in to fewer blocks. For example, in some cases, BIST controller 301 may be combined with sequencer 303. Conversely, any given one of the modules of FIGS. 2 and/or 3 may be implemented such that its operations are divided among two or more logical blocks. Although shown with a particular configuration, in other embodiments these various modules or blocks may be rearranged in other suitable ways. For example, in some cases, one or more the modules within BIST circuit 300 such as, for example, BIST controller 301, may be shared between different instantiations of other modules 303, 304, 305, and/or 309. Additionally or alternatively, BIST circuit 300 may be shared or otherwise configured to manage other memories in addition to memory circuitry 308.

Figure 4:
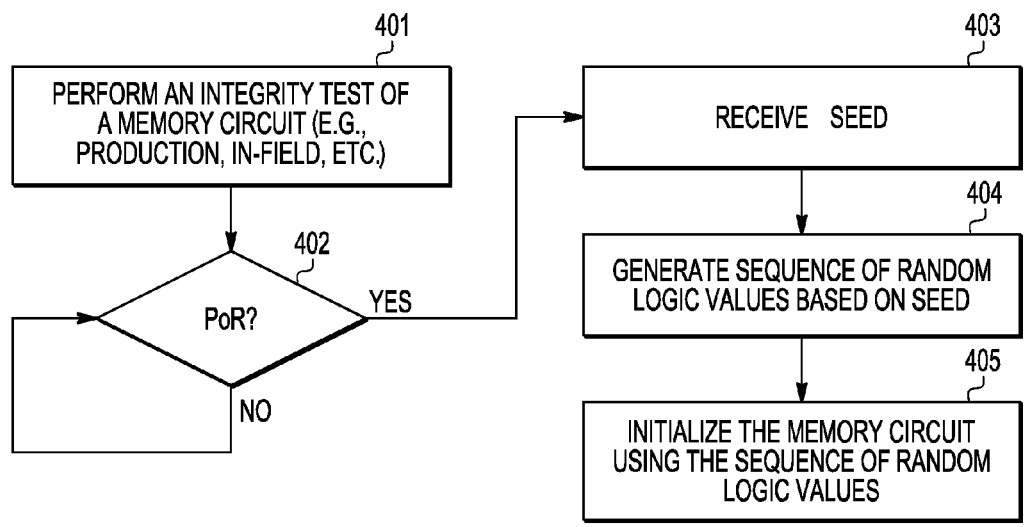
FIG. 4 is a flowchart illustrating an example of a method of initializing memory circuitry according to some embodiments.

FIG. 4 is a flowchart illustrating an example of a method of initializing memory circuitry. In some embodiments, method 400 may be performed, at least in part, by BIST circuit 300 shown in FIG. 3. A shown, at block 401, method 400 may operate in "self-test" mode to perform an integrity test of a memory circuit. For example, in "self-test" mode, BIST circuit 300 may verify that memory circuitry 308 is operating properly. Such a test may be performed, for example, in a semiconductor fabrication facility and/or in response to a user's command.

Upon completion of the integrity test, method 400 may operate in "memory "initialization mode." Particularly, at block 402, method 400 may include detecting a PoR event. If such an event takes place upon startup or power-up of the device, for example, then, at block 403, method 400 may include receiving or generating a seed state.

For example, PRNG circuitry 306 of data generator 305 may receive or identify a chip ID (e.g., Exclusive/Electronic Chip ID or ECID, Central Processing Unit ID or CPUID, device ID, vendor ID, etc.), manufacturing ID (e.g., lot number, serial number, model number, etc.), memory ID (e.g., model number, version number, type, etc.), or the like. Other types of static IDs may include, for example, a Media Access Control (MAC) address, an Organizationally Unique Identifier (OUI), or other suitable hardware identifier. Additionally or alternatively, PRNG circuitry 306 may receive other information that varies dynamically over time, such as, for example, a clock signal and/or other timing information (e.g., time of the day, day of the year, etc.). Moreover, in some cases, PRNG circuitry 306 may combine two or more of these different pieces of information or part(s) thereof, for example, using an XOR gate or other suitable logic circuitry to generate a unique seed state.

At block 404, method 400 may include generating a sequence of random logic values based upon the seed state received or produced in block 403. Then, at block 405, method 400 may include initializing the memory circuit (e.g., memory circuitry 308 in FIG. 3) using the sequence of random logic values.

It should be understood that the various operations described herein, particularly in connection with FIG. 4, may be implemented by processing circuitry or other hardware components. The order in which each operation of a given method is performed may be changed, and various elements of the systems illustrated herein may be added, reordered, combined, omitted, modified, etc. For instance, although illustrated as taking place after completion of an integrity test, in some cases blocks 402-405 may be executed independently of the performance of such an integrity test (e.g., block 401 may be absent or otherwise not relevant). Also, in some implementations, detection of a PoR event at block 402 may be replaced with receipt of an initialization command issued by a user and/or by other chip component. It is intended that the invention(s) described herein embrace all such modifications and changes and, accordingly, the above description should be regarded in an illustrative rather than a restrictive sense.

In some applications, a memory circuit may be embedded into a networked device or system. A type of attack against networked system exploits buffer overflows in combination with a known or likely state of a system's memory resources to cause privilege escalation. At least in part to increase the system's resilience against this type of attack, certain systems and methods described herein may cause a memory to be initialized with random sequences of logic values generated based upon device specific, memory specific, and/or dynamically varying seed states. As such, in some cases, different memory modules within a same chip and/or different chips of a same device and/or across different devices may be initialized with different values. Also, those values may change over time in a generally unpredictably manner at every reset sequence, thus making it difficult for an attacker to exploit pre-existing content of memories.

It should be noted that, although memory initialization in software is a possible alternative, it is generally costly in terms of runtime, inapplicable to certain types of memories, and can be potentially circumvented. In contrast, the hardware-based systems and methods described herein may make use of certain existing BIST circuitry to perform the memory initialization procedure. Although the foregoing examples describe using BIST circuitry specifically, however, in other embodiments other existing memory circuitry (e.g., memory controller(s), interface(s), etc.) may be adapted to perform similar operations. Also, although the foregoing examples describe initializing a memory using a pseudo-random sequence of logic values, in other embodiments other types of sequences may be used.

In an illustrative, non-limiting embodiment, a method may include, after completion of an integrity test of a memory circuit, generating a sequence of random logic values using a BIST circuit. The method may also include initializing the memory circuit with the sequence of random logic values using the BIST circuit. For example, generating the sequence of random logic values may include using a PRNG circuit within the BIST circuit.

In some implementations, the method may include receiving a seed state at a PRNG portion of the BIST circuit, the seed state having been provided by another circuit external to the BIST circuit. For instance, the seed state may include memory circuit identification stored in the memory circuit. The seed state may include chip identification stored in another memory circuit of a same chip where the memory circuit is located. Additionally or alternatively, the seed state may include timing or clock information. Additionally or alternatively, the seed state may include a combination of two or more pieces of information selected from the group consisting of: memory circuit identification, chip identification, and clock information. In some cases, the initializing may be performed in response to a PoR event.

In another illustrative, non-limiting embodiment, a method may include generating, using a BIST circuit, a random sequence of logic values independently of performance of an integrity test of a memory circuit. The method may also include initializing the memory circuit with the sequence of random logic values using the BIST circuit. Again, in some cases, the integrity test may be part of a production or in-field test, and the initializing may be performed in response to a PoR event.

The method may also include generating, by the BIST circuit in response to a subsequent PoR event, another random sequence of logic values, and initializing the memory circuit with the other sequence of random logic values using the BIST circuit. For example, generating the random sequence of logic values may include receiving a seed state at a PRNG circuit within the BIST circuit, the seed state including information selected from the group consisting of: memory circuit identification, chip identification, and timing information. Additionally or alternatively, the method may include generating, using the BIST circuit, another random sequence of logic values independently of performance of another integrity test of another memory circuit located on a same integrated circuit as the memory circuit, and initializing the other memory circuit with the other sequence of random logic values using the BIST circuit.

In yet another illustrative, non-limiting embodiment, an integrated circuit may include a BIST controller and a PRNG circuit operably coupled to the BIST controller, the PRNG circuit configured to receive a seed state and to generate a sequence of random logic values usable to initialize a memory circuit irrespective of an integrity test performed upon the memory circuit. For example, the PRNG circuit may be configured to receive the seed state from at least one of: the memory circuit, another memory circuit, or a clock circuit.

In some cases, the PRNG circuit may be configured to receive a different seed state and to generate a different sequence of random logic values usable to re-initialize the memory circuit after the initialization. Additionally or alternatively, the PRNG circuit may be configured to receive a different seed state and to generate a different sequence of random logic values usable to initialize another memory circuit outside of another integrity test performed upon the other memory circuit. Also, the integrity test may be part of a production test and/or of an in-field test. The BIST controller may be further configured to receive an indication of a PoR event and to cause the initialization of the memory circuit with the sequence of random logic values in response to the PoR event.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A method, comprising:
    after completion of a Built-In-Self-Test (BIST) procedure in an integrated circuit including a first memory circuit, a second memory circuit, and a BIST circuit coupled to the first and second memory circuits, the BIST circuit further including a BIST controller, a sequencer circuit coupled to the BIST controller, and an address generator circuit, comparator circuit, and data generator circuit coupled to the sequencer circuit, and a Pseudo-Random Number Generator (PRNG) circuit coupled to the data generator circuit;
    receiving, by the PRNG circuit, a seed state and generating a sequence of random logic values usable to initialize the first memory circuit in response to a Power-On-Reset (PoR) event as part of a memory initialization operation subsequent to a first BIST test performed upon the first memory circuit by the BIST circuit, wherein the initialization of the first memory circuit operation is invoked outside of any testing procedure of the first memory circuit and during normal operation of the first memory circuit; and
    receiving, by the PRNG circuit, a different seed state and generating a different sequence of random logic values usable to initialize the second memory circuit as part of another memory initialization operation subsequent a second BIST test performed upon the second memory circuit by the BIST circuit, wherein the initialization of the second memory circuit operation is invoked outside of any testing procedure of the second memory circuit and during normal operation of the second memory circuit, wherein the BIST controller, sequencer circuit, address generator circuit, and data generator circuit are turned on during: the first BIST test, the second BIST test, and the memory initialization operations, and wherein the comparator circuit is turned on during the first and second BIST tests and turned off during the memory initialization operations.

2. The method of claim 1, wherein the seed state is provided by another circuit external to the BIST circuit.

3. The method of claim 1, wherein the seed state includes memory circuit identification stored in the memory circuit.

4. The method of claim 1, wherein the seed state includes chip identification stored in another memory circuit of a same chip where the memory circuit is located.

5. The method of claim 1, wherein the seed state includes timing or clock information.

6. The method of claim 1, wherein the seed state includes information selected from the group consisting of: memory circuit identification and chip identification.

7. A method, comprising:
receiving a seed state;
generating a sequence of random logic values usable to initialize a first memory circuit in response to a Power-On-Reset (PoR) event as part of a memory initialization operation after completion of a first BIST test, wherein the initialization of the first memory circuit operation is invoked outside of any testing procedure of the first memory circuit and during normal operation of the first memory circuit;
after completion of a second BIST test performed upon the second memory circuit, receiving a different seed state; and
generating a different sequence of random logic values usable to initialize the second memory circuit as part of another memory initialization operation after completion of a second BIST test, wherein the initialization of the second memory circuit operation is invoked outside of any testing procedure of the second memory circuit and during normal operation of the second memory circuit, wherein the BIST circuit includes: a BIST controller, a sequencer, an address generator, a data generator, and a comparator, wherein the BIST controller, sequencer, address generator, and data generator are turned on during: the first BIST test, the second BIST test, and the memory initialization operations, and wherein the comparator is turned on during the first and second BIST tests and turned off during the memory initialization operations.

8. An integrated circuit, comprising:
a first memory circuit;
a second memory circuit; and
a Built-In-Self-Test (BIST) circuit coupled to the first and second memory circuits, the BIST circuit further comprising:
a BIST controller;
a sequencer circuit coupled to the BIST controller;
an address generator circuit, a comparator circuit, and a data generator circuit coupled to the sequencer circuit; and
a Pseudo-Random Number Generator (PRNG) circuit operably coupled to the data generator circuit, the PRNG circuit configured to receive a seed state and to generate a sequence of random logic values usable to initialize the first memory circuit in response to a Power-On-Reset (PoR) event as part of a memory initialization operation after completion of a first BIST test performed upon the first memory circuit by the BIST circuit, wherein the initialization of the first memory circuit operation is invoked outside of any testing procedure of the first memory circuit and during normal operation of the first memory circuit, the PRNG circuit further configured to receive a different seed state and to generate a different sequence of random logic values usable to initialize the second memory circuit as part of another memory initialization operation after completion of a second BIST test performed upon the second memory circuit by the BIST circuit, wherein the initialization of the second memory circuit operation is invoked outside of any testing procedure of the second memory circuit and during normal operation of the second memory circuit, wherein the BIST controller, sequencer circuit, address generator circuit, and data generator circuit are turned on during: the first BIST test, the second BIST test, and the memory initialization operations, and wherein the comparator circuit is turned on during the first and second BIST tests and turned off during the memory initialization operations.

9. The integrated circuit of claim 8, the PRNG circuit configured to receive the seed state from at least one of: the first memory circuit, the second memory circuit, or another memory circuit.

10. The integrated circuit of claim 8, the PRNG circuit configured to receive a different seed state and to generate a different sequence of random logic values usable to re-initialize the first memory circuit after the initialization.

11. The integrated circuit of claim 8, the PRNG circuit configured to receive a different seed state and to generate a different sequence of random logic values usable to initialize another memory circuit within the integrated circuit subsequently to another BIST test performed upon the other memory circuit by the BIST circuit.

12. The integrated circuit of claim 8, wherein the BIST tests are part of the integrated circuit's production.

13. The integrated circuit of claim 8, wherein the BIST tests are part of the integrated circuit's in-field operation.

* * * * *